United States Patent [19]
Baba et al.

[11] Patent Number: 4,558,434
[45] Date of Patent: Dec. 10, 1985

[54] SEMICONDUCTOR MEMORY DEVICE

[75] Inventors: Fumio Baba; Hirohiko Mochizuki; Hatsuo Miyahara, all of Kawasaki, Japan

[73] Assignee: Fujitsu Limited, Kawasaki, Japan

[21] Appl. No.: 573,641

[22] Filed: Jan. 25, 1984

[30] Foreign Application Priority Data

Jan. 31, 1983 [JP] Japan .................................. 58-12987

[51] Int. Cl.[4] ............................................ G11C 11/40
[52] U.S. Cl. ..................................... 365/189; 365/190
[58] Field of Search ............... 365/182, 189, 190, 174, 365/230, 202

[56] References Cited
U.S. PATENT DOCUMENTS 4,379,342  4/1983  Nakano et al. ...................... 365/182

Primary Examiner—Joseph A. Popek
Attorney, Agent, or Firm—Staas & Halsey

[57] ABSTRACT

A semiconductor memory device having matrix-arranged memory cells, carrying out data write or read operations to or from a selected memory cell through a pair of data buses by the selection of a word line and a pair of bit lines, includes two transfer devices which transfer data between bit lines and data buses and which are separately operated for either writing or reading. Even if a data read operation is stopped midway by a system reset or the like, the stored data in the memory cell is not destroyed.

6 Claims, 4 Drawing Figures

SEMICONDUCTOR MEMORY DEVICE

BACKGROUND OF THE INVENTION

1. Field of the Invention

The present invention relates to a semiconductor memory device, more particularly to a semiconductor memory device provided with two separate circuits used during write and read operations, respectively, for data transfer between bit lines and data buses.

2. Description of the Prior Art

In a semiconductor memory device, for example, a dynamic random access memory (DRAM) comprising matrixarranged memory cells, the memory cells are connected at the cross points of word lines and bit lines. Row selection of the memory cells is performed by selection of a word line. Column selection of the memory cells is performed by selection of a pair of bit lines in response to the output of a column decoder. Each bit line pair is connected to a sense amplifier. Each sense amplifier is also connected to a pair of dummy cells. In reading stored data, when one of the right-side memory cells is selected, the left-side dummy cell is selected. When one of the left-side memory cells is selected, the right-side dummy cell is selected. The selected dummy cell provides a reference potential during the read operation from the selected memory cell.

Between each bit line and one of a pair of data buses, a transfer gate is connected as a data transfer circuit. The signal read from the memory cell connected to the selected word line is transferred to the pair of bit lines, amplified by the sense amplifier, and supplied to the data buses through the transfer gates. In write operations, write data signals supplied from the data buses, which are usually in the form of complementary signals, are transferred to the bit lines through the transfer gates and one of the selected data signals is written into the write memory cell. In the last part of the read operation period in most practical DRAM'S, the bit lines are driven by a buffer circuit which is connected to the data buses to provide amplified output signals. That is, a rewrite operation is performed via the transfer gates to restore the bit line potential which was lost during the preceding part of the read operation period and which drove the data buses.

However, it is desirable to prevent the data stored in the memory cells from being destroyed, even if the read operation is stopped halfway. Interruption of a read operation should be permitted in order to facilitate the timing design of a system using the memory device. If the semiconductor memory device enters a precharge mode prior to the rewrite operation, the potential on the bit line, which has been changed due to redistribution of electric charge via the transfer gate between the bit lines and the data buses, is stored in the selected memory cell if there is an interruption. This results in possible destruction of the stored data in the memory cell.

SUMMARY OF THE INVENTION

An object of the present invention is to provide a semiconductor memory device, in which data stored in a memory cell is not destroyed when a data read operation stops midway due to a system reset or the like.

According to the present invention, there is provided a semiconductor memory device which includes a word line, a pair of bit lines, a memory cell connected to the word line and one of the bit lines, a pair of data buses, a first transfer circuit connected between the pair of bit lines and the pair of data buses for transferring data from the data buses to the bit lines in a write operation, and a second transfer circuit connected between the pair of bit lines and the pair of data buses for transferring data from the bit lines to the data buses in a read operation without substantially changing the potential of the bit lines.

Use of the device prevents redistribution of electric charge from causing fluctuation of the potential of the bit line to a middle level during a read operation. Therefore, even if a system reset occurs at any time during a read operation, the data in the memory cell is not destroyed. As a result, the semiconductor memory device does not impose any restriction upon the system as to the timing of the termination of a read access.

DESCRIPTION OF PREFERRED EMBODIMENTS

Figure 1:
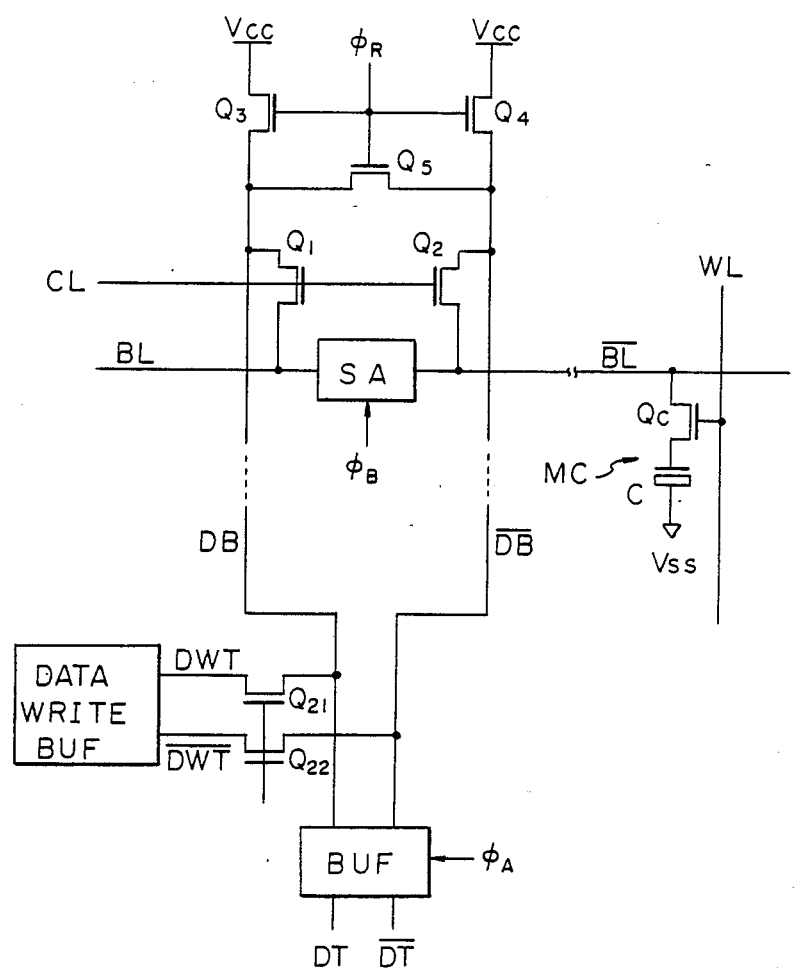
FIG. 1 is a partial block circuit diagram of a conventional semiconductor memory device.

Prior to describing an embodiment of the present invention, an explanation of a conventional DRAM will be given with reference to FIG. 1 for comparative purposes. The DRAM of FIG. 1 comprises a sense amplifier SA, a pair of bit lines BL and $\overline{BL}$ connected to the sense amplifier SA, a pair of data buses DB and $\overline{DB}$, and transistors Q1 and Q2 connected between the bit line BL and the data bus DB and between the bit line $\overline{BL}$ and the data bus $\overline{DB}$, respectively, as transfer gates. A memory cell MC comprising a transistor Qc and a capacitor C is connected between the bit line $\overline{BL}$ and a word line WL. Between one end of each of the data buses DB and $\overline{DB}$ and a power source Vcc are connected transistors Q3 and Q4 for precharging and resetting the data buses DB and $\overline{DB}$, respectively. Also, between the data buses DB and $\overline{DB}$ is connected a transistor Q5 for equalizing the potentials of the buses during resetting. The gates of transistors Q3, Q4 and Q5 receive a reset clock signal $\phi_R$. The other ends of the data buses DB and $\overline{DB}$ are connected to a data buffer BUF. Of course, although FIG. 1 indicates only one pair of bit lines BL and BL, one word line WL, one sense amplifier SA, one pair of data buses DB and $\overline{DB}$, and the like, a plurality of these elements are actually provided.

The operation of the DRAM in FIG. 1 will now be explained with reference to FIG. 2. The reset clock signal $\phi_R$ has a high level during the reset or precharge period in which a row address strobe signal $\overline{RAS}$ is applied to the memory device with a high level. The reset clock signal $\phi_R$ turns on all the transistors Q3, Q4 and Q5 and resets the potentials on the data buses DB and $\overline{DB}$ to a high level.

Next, the row address strobe signal $\overline{RAS}$ changes to a low level to initiate the read or write operation, and a row address signal is applied to the row decoder to select one word line WL. As a result, the selected word line WL will have a high level and the transistor Qc in the memory cell MC connected to the word line WL turns on to change the potential of the bit line $\overline{BL}$ from its precharge level through redistribution of electric charge between the cell MC and the bit line $\overline{BL}$.

Concurrently, a dummy cell (not shown) connected to the other bit line BL is selected to provide a potential change on the bit line BL which forms a reference level with respect to the potential of the opposite bit line $\overline{BL}$. Thus a potential difference is formed between the bit line pair BL and $\overline{BL}$ depending on the amount of charge stored in the memory cell MC.

Then, when a sense-amplifier enable clock signal $\phi_B$ is applied to the sense amplifier SA with a high level, the potential difference between the bit lines BL and $\overline{BL}$ is amplified, corresponding to the data in the memory cell MC. In the meantime, a column address signal has been received in response to the falling of the column address strobe signal $\overline{CAS}$ to generate a column selection signal CL from a column decoder (not shown). When the potential difference between the bit lines BL and $\overline{BL}$ is amplified sufficiently, the column selection signal CL is applied to the gates of the transistors Q1 and Q2 with a high level and the the transistors Q1 and Q2 are turned on. As a result, the signals on the bit lines BL and BL are transferred to the data buses DB and $\overline{DB}$, respectively, and a potential difference is generated between the data buses DB and $\overline{DB}$. Then, a clock signal $\phi_A$ changes to a high level to activate the data buffer BUF, which amplifies the potential difference between the data buses DB and $\overline{DB}$ and outputs read data via data lines DT and $\overline{DT}$.

When writing data into the memory cell MC, write signals are supplied to the data buses DB and $\overline{DB}$ on data write lines DWT and $\overline{DWT}$, from a data write buffer DATA WRITE BUF through data write control gates Q21 and Q22. The write signals are transferred to the pair of bit lines BL and $\overline{BL}$ through the transistors Q1 and Q2 used as transfer gates, and the data is written into the memory cell MC.

In the conventional DRAM of FIG. 1, if, during a data read operation, the DRAM enters a precharge mode in which the $\overline{RAS}$ signal has a high level, there is a possibility of destruction of data in the memory cell MC. Namely, as illustrated in FIG. 2, after the sense-amplifier enable clock signal $\phi_B$ becomes a high level and the potential difference between the bit lines BL and $\overline{BL}$ is amplified, the column selection signal CL becomes a high level and the bit lines BL and $\overline{BL}$ are connected to the data buses DB and $\overline{DB}$, respectively. As a result, redistribution of the electric charge occurs between the electrostatic capacitance of the bit line $\overline{BL}$ and the capacitor C and the electrostatic capacitance of the data bus $\overline{DB}$. The potential on the bit line $\overline{BL}$ therefore temporarily rises from a low level to a higher level. In the last part of the normal read cycle, the potential difference is amplified again by the data buffer BUF, which is basically comprised of a crosscoupled transistor pair forming a latch circuit.

Figure 2:
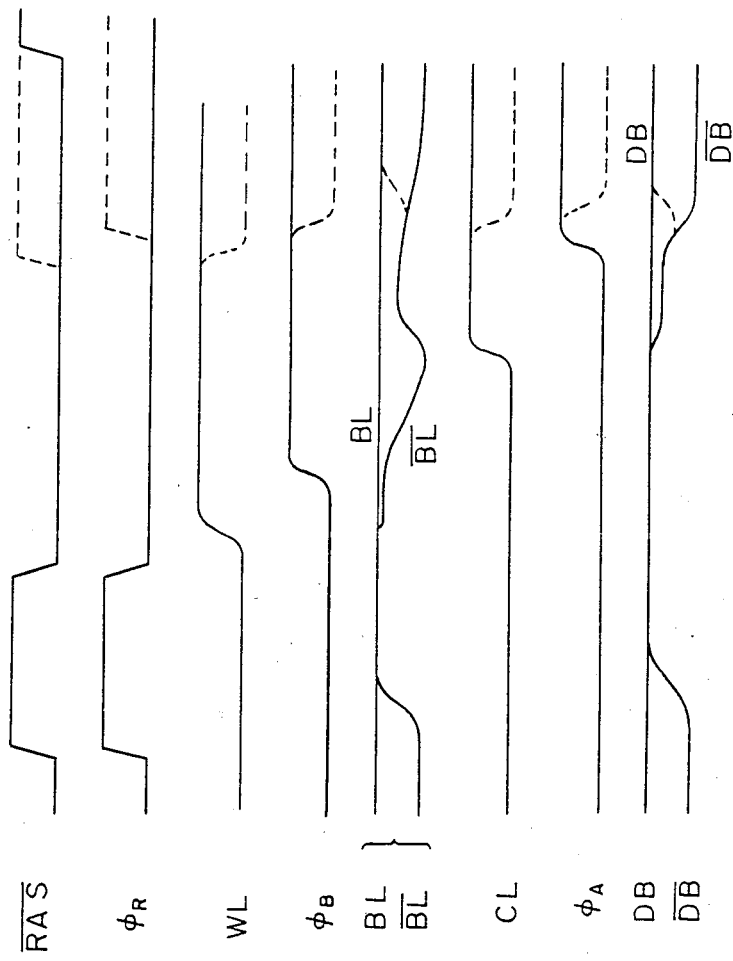
FIG. 2 is a waveform diagram of the operation of the device of FIG. 1.

If, however, a processor or the like connected to the DRAM of FIG. 1 commands the DRAM to enter the precharge mode prior to the activation of the data buffer BUF by resetting the row address strobe signal $\overline{RAS}$ and the like, as illustrated by the broken lines in FIG. 2, the potential on the word line WL becomes a low level, and the transistor Qc in the memory cell MC is cut off. Therefore, the capacitor C in the memory cell MC stores a potential having a medium level. Thus, there is a possibility of storing erroneous data. Namely, in the conventional DRAM of FIG. 1, there is a disadvantage in that resetting of the processor or the like connected to the DRAM may destroy the stored data in the case where the period of the read cycle defined by the row address strobe signal $\overline{RAS}$ is shorter than a predetermined period.

Figure 3:
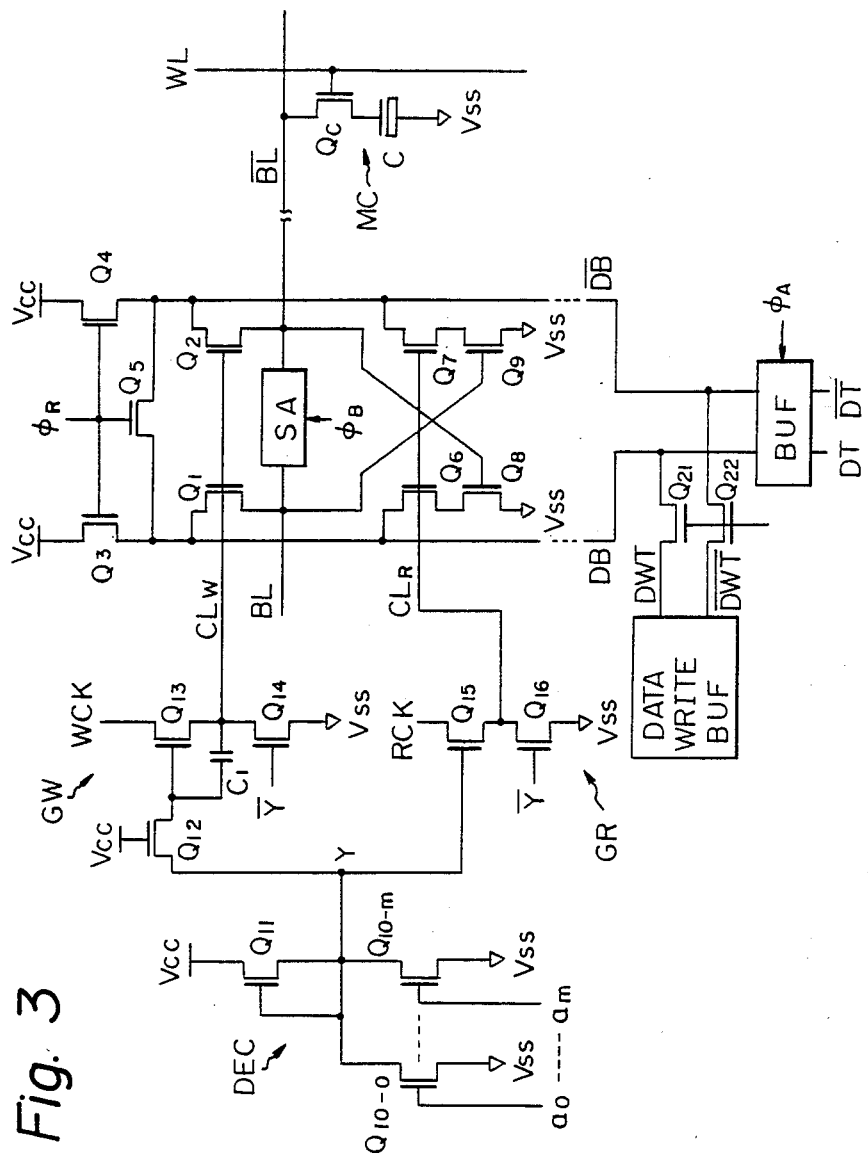
FIG. 3 is a partial block circuit diagram of a semiconductor memory device according to an embodiment of the present invention.

Hereinafter, a semiconductor memory device according to an embodiment of the present invention will be explained. FIG. 3 shows a partial diagram of a DRAM according to this embodiment of the present invention. In FIG. 3, elements identical with the elements of FIG. 1 bear identical reference characters. One of the important differences between the DRAM of FIG. 3 and that of FIG. 1 is that the former transfers data between the bit lines BL and $\overline{BL}$ and the data buses DB and $\overline{DB}$ using separate data transfer circuits for write and read operations. Namely, during a write operation, the transistor Q1 connecting the bit line BL and the data bus DB and the transistor Q2 connecting the bit line $\overline{BL}$ and the data bus $\overline{DB}$ are used. During a read operation, the data transfer circuit comprising transistors Q6, Q7, Q8 and Q9 is used.

The transistors Q6 and Q8 are series-connected between the data bus DB and a power source Vss, ground for example, and the transistors Q7 and Q9 are series-connected between the data bus $\overline{DB}$ and the power source Vss. The gates of the transistors Q6 and Q7 receive a column selection signal $CL_R$ for reading. Also, the gates of the transistors Q8 and Q9 are connected to the bit lines $\overline{BL}$ and BL, respectively. The gates of the transistors Q1 and Q2, the transfer gates for writing, received a column selection signal $CL_W$ for writing.

The signal $CL_W$ is controlled by a write clock signal WCK and supplied by a writing gate circuit GW comprising transistors Q12, Q13 and Q14, and a capacitor C1. The column selection signal $CL_R$ for reading is controlled by a read clock signal RCK and supplied by a reading gate circuit GR comprising transistors Q15 and Q16. A column decoder DEC comprises transistors Q10-0, ..., Q10-m to which m+1 bits of a column address signal ao, ..., am are supplied, respectively, and a load transistor Q11. The column decoder DEC generates a column decode signal Y and supplies it to the gate circuits GW and GR. Also, the column decoder DEC comprises an inverter circuit (not shown), generates a signal $\overline{Y}$ by inverting the signal Y, and applies the signal $\overline{Y}$ to selected transistors in the writing and reading gate circuits GW and GR.

The operation of the DRAM of FIG. 3 is explained with reference to FIG. 4. In reading data from a selected memory cell MC, during the preceding reset or precharge period in which the row address strobe signal $\overline{RAS}$ supplied to the memory device has a high level, the reset clock $\phi_R$ has a high level, the transistors Q3, Q4 and Q5 are all in an on-state, and the potentials of the data buses DB and $\overline{DB}$ are reset to a high level. Also, the potentials of both the bit lines BL and $\overline{BL}$ are set to a high level by a precharge circuit (not shown). Then, when the row address strobe signal $\overline{RAS}$ falls to a low level to initiate the read cycle, address signals then appearing at address input terminals of the memory device are captured as row address signals, which provide one selected word line WL with a selection signal through the row decoder. Therefore, the one word line WL selected by the row address signal now carries a high level signal, the transistor Qc in the memory cell MC is turned on, and the capacitor C is connected to the bit line $\overline{BL}$. Then, a sense-amplifier enable clock signal $\phi_B$ is changed to a high level and the sense amplifier SA is activated.

As a result, the potential difference between the bit lines BL and $\overline{BL}$ is amplified, and, for example, the potential on the bit line BL is kept at a high level and the potential on the bit line $\overline{BL}$ is pulled down to a low level. Meanwhile, column address signals are obtained in response the falling of the column address strobe signal $\overline{CAS}$ in a similar manner and are applied to the column decoder to generate an output column decode signal. In this state, the output Y of the selected column decoder DEC and the read clock signal RCK have a high level, and the inverted column decode signal $\overline{Y}$ has a low level. Thus, the column selection signal $CL_R$ for reading has a high level.

As a result, the transistors Q6 and Q7 are turned on, and, since the bit line BL has a high level and the bit line $\overline{BL}$ has a low level, the transistor Q9 is turned on and the transistor Q8 is turned off. Therefore, the potential on the data bus $\overline{DB}$ is pulled down to a low level, and the potential on the data bus DB is held at a high level. In this state, the clock signal $\phi_A$ is changed to a high level, the data buffer BUF operates, and the output signal from the data buses DB and $\overline{DB}$ is sent out to the data line DT and $\overline{DT}$. By the above-mentioned operations, the read operation of the memory cell MC is carried out. Since the data transfer transistors Q8 and Q9 perform inversion of data, the bit line pair BL and $\overline{BL}$ are cross-coupled to these transistors Q8 and Q9 to maintain the coincidence of the written data and the read data.

In performing such a read operation, in the DRAM of FIG. 3, the potentials of the data buses DB and $\overline{DB}$ are controlled by the potentials of the bit lines BL and $\overline{BL}$ through the gates of the transistors Q9 and Q8. The bit lines BL and $\overline{BL}$ are not directly connected to the data buses DB and $\overline{DB}$ through the transfer gate circuits, therefore, no redistribution of electric charge occurs between bit lines BL and $\overline{BL}$ and data buses DB and $\overline{DB}$ and, when the column selection signal $CL_R$ for reading has a high level, the potential of the bit lines is prevented from fluctuating to the neutral level (or middle level between the high and low levels).

Figure 4:
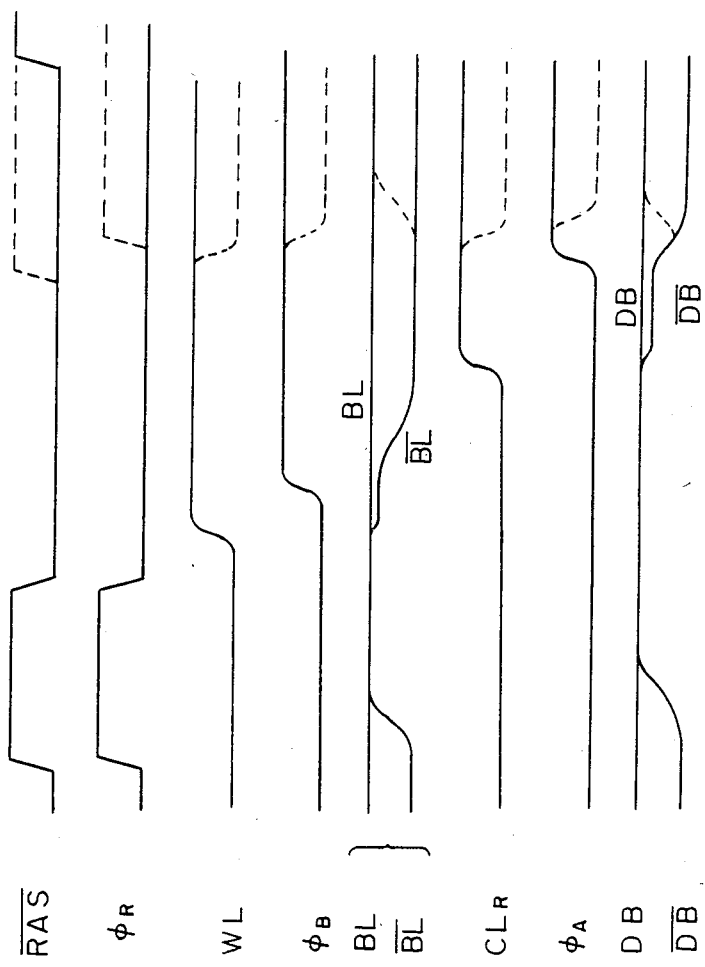
FIG. 4 is a waveform diagram of the operation of the device of FIG. 3.

Namely, as shown in FIG. 4, for example, the potential on the bit line BL remains at a high level, and the potential on the bit line $\overline{BL}$ can be maintained at a low level. Thus, even if the DRAM enters the reset or precharge mode midway through the read operation, as illustrated with the broken lines in FIG. 4, no erroneous data is rewritten into the memory cell MC. In addition, in FIG. 4, the potential of the bit line $\overline{BL}$ rises to a high level after system resetting, as indicated by the broken line. Since, however, the row address strobe signal $\overline{RAS}$ already has a high level and the word line WL has a low level, the transistor Qc is cut off, and the capacitor C in the memory cell MC is separated from the bit line $\overline{BL}$. Therefore, there is no possibility of writing erroneous data into the memory cell MC.

When writing data into the memory cell MC using the DRAM of FIG. 3, write data supplied to the data buses DB and $\overline{DB}$ from data write lines DWT and $\overline{DWT}$ through data write control gates Q21 and Q22 are transferred to the bit lines BL and $\overline{BL}$ through the transistors Q1 and Q2. At this time, both the decoded output Y of the column decoder DEC and the write clock signal WCK have a high level, and the inverted decode signal $\overline{Y}$ has a low level. This results in the column selection signal $CL_W$ for writing having a high level and the transistors Q1 and Q2 being turned on.

In the above embodiment, each column comprising a pair of bit lines in provided with a column decoder DEC and gate circuits GW and GR. However, it is possible to modify this embodiment so that only one set of circuits DEC, GW and GR is provided for a plurality of columns by adding a column selection device. For example, if two data bus pairs are provided for the sense amplifiers which are alternately connected thereto, only one set of the column control circuits DEC, GW and GR need to be provided for every two columns to control the two columns in common. The number of necessary column decoders can be further decreased by using different column selection means devices, for example, column selection lines and selection gates, so that more than one pair of gate circuits GW and GR are driven by a common decoder output through the selection gates. In these modifications, however, still one set of write transfer gates Q1 and Q2 and read transfer gate circuits Q6 to Q9 should be provided for each bit line pair.

We claim:

1. A semiconductor memory device, comprising:
   a word line;
   a pair of bit lines having potentials;
   a memory cell operatively connected to said word line and one of said bit lines;
   a pair of data buses;
   first transfer means, operatively connected to said pair of bit lines and said pair of data buses, for transferring data from said pair of data buses to said pair of bit lines during a write operation; and
   second transfer means, operatively connected to said pair of bit lines and said pair of data buses, for transferring data from said pair of bit lines to said pair of data buses during a read operation without substantially changing the potentials of said pair of bit lines.

2. A semiconductor memory device as set forth in claim 1,
   wherein each of the bit lines in said pair of bit lines has a corresponding data bus in said pair of data buses, and
   wherein said second transfer means comprises a first pair of transistors, each of said first pair of transistors operatively connected to the corresponding data bus for one of the bit lines in said pair of bit lines and having a gate operatively connected to the other bit line in said pair of bit lines for being controlled in response to the potential of the other bit line in said pair of bit lines.

3. A semiconductor memory device as set forth in claim 2, and operatively connectable to receive a read column selection signal, wherein said second transfer means further comprises a second pair of transistors, each of said second pair of transistors operatively connected to one of said first pair of transistors and the corresponding data bus, and connectable to receive the read column selection signal.

4. A semiconductor memory device as set forth in claim 1, further comprising:
   first means, operatively connected to said first transfer means, for providing a column selection signal for writing; and
   second means, operatively connected to said second transfer means, for providing a column selection signal for reading.

5. A semiconductor memory device as set forth in claim 4, and operatively connectable to receive a column decode signal, an inverted column decode signal and a write clock signal, wherein said first means comprises:

a first transistor operatively connected to said first transfer means and connectable to receive the column decode signal and the write clock signal;

a capacitor operatively connected to said first transfer means and connectable to receive the column decode signal; and a second transistor operatively connected to said first transfer means and ground, and connectable to receive the column decode signal.

6. A semiconductor memory device as set forth in claim 4, and operatively connectable to receive a column decode signal, an inverted column decode signal and a read clock signal, wherein said second means comprises:

a first transistor operatively connected to said second transfer means and connectable to receive the column decode signal and the read clock signal; and a second transistor operatively connected to said second transfer means and ground, and connectable to receive the inverted column decode signal.

* * * * *